United States Patent
Zhang et al.

(10) Patent No.: US 8,932,892 B2
(45) Date of Patent: Jan. 13, 2015

(54) EPITAXIAY WAFER, METHOD FOR MANUFACTURING THE SAME AND METHOD FOR MANUFACTURING LED CHIP

(75) Inventors: Wang Zhang, Guangdong (CN); Xilin Su, Guangdong (CN); Chunlin Xie, Guangdong (CN); Hongpo Hu, Guangdong (CN)

(73) Assignees: Shenzhen BYD Auto R&D Company Limited, Shenzhen, Guangdong (CN); BYD Company Limited, Shenzhen, Guangdong (CN)

( * ) Notice: Subject to any disclaimer, the term of this patent is extended or adjusted under 35 U.S.C. 154(b) by 168 days.

(21) Appl. No.: 13/536,745

(22) Filed: Jun. 28, 2012

(65) Prior Publication Data

US 2012/0267607 A1 Oct. 25, 2012

Related U.S. Application Data

(63) Continuation of application No. PCT/CN2010/077604, filed on Oct. 8, 2010.

(30) Foreign Application Priority Data

Dec. 29, 2009 (CN) .......................... 2009 1 0258858

(51) Int. Cl.
*H01L 21/00* (2006.01)
*H01L 33/00* (2010.01)
(Continued)

(52) U.S. Cl.
CPC .......... *H01L 33/007* (2013.01); *H01L 21/0237* (2013.01); *H01L 21/02458* (2013.01);
(Continued)

(58) Field of Classification Search
CPC ...... H01L 21/00; H01L 33/32; H01L 21/0254
USPC .................. 438/47; 257/13, 14, 12, E33.008, 257/E31.003, E29.069, E29.072, E29.248
See application file for complete search history.

(56) References Cited

U.S. PATENT DOCUMENTS

2003/0173578 A1 9/2003 Schaff et al.
2006/0051938 A1 3/2006 Connell et al.
(Continued)

FOREIGN PATENT DOCUMENTS

CN 1881625 A 12/2006
CN 1983653 A 6/2007
(Continued)

OTHER PUBLICATIONS

Extended European Search Report dated Oct. 24, 2013, issued in European Application No. 10840425.2 (7 pages).
(Continued)

*Primary Examiner* — Timor Karimy
(74) *Attorney, Agent, or Firm* — Finnegan, Henderson, Farabow, Garrett & Dunner, LLP (57) ABSTRACT

A method for manufacturing an epitaxial wafer for a light emitting diode (LED) is provided. The method may comprise: forming a back coating layer on a back surface of a substrate; forming a buffer layer on a top surface of the substrate; forming an N-type semiconductor layer on the buffer layer; forming a multi-quantum well layer on the N-type semiconductor layer; and forming a P-type semiconductor layer on the multi-quantum well layer. An epitaxial wafer and a method for manufacturing an LED chip are also provided.

18 Claims, 5 Drawing Sheets

(51) Int. Cl.
*H01L 21/02* (2006.01)
*H01L 33/12* (2010.01)
*H01L 33/32* (2010.01)

(52) U.S. Cl.
CPC ...... *H01L21/0254* (2013.01); *H01L 21/02546* (2013.01); *H01L 21/02576* (2013.01); *H01L 21/02579* (2013.01); *H01L 21/0262* (2013.01); *H01L 21/02658* (2013.01); *H01L 33/0079* (2013.01); *H01L 33/12* (2013.01); *H01L 33/32* (2013.01)
USPC ........................................................ 438/47

(56) References Cited

U.S. PATENT DOCUMENTS

| | | | | |
|---|---|---|---|---|
| 2006/0255341 | A1* | 11/2006 | Pinnington et al. | 257/79 |
| 2007/0172973 | A1 | 7/2007 | Yoo | |
| 2007/0241352 | A1* | 10/2007 | Yasuda et al. | 257/94 |
| 2007/0254390 | A1 | 11/2007 | Bour et al. | |
| 2009/0179211 | A1 | 7/2009 | Yoo et al. | |
| 2010/0327311 | A1* | 12/2010 | Kaji et al. | 257/103 |

FOREIGN PATENT DOCUMENTS

| | | |
|---|---|---|
| EP | 0507420 A1 | 10/1992 |
| JP | H 1-125917 A | 5/1989 |
| JP | 2004-014587 A | 1/2004 |
| JP | 2005-116785 A | 4/2005 |
| JP | 2009-190965 A | 8/2009 |
| WO | WO 2007/002644 A2 | 1/2007 |
| WO | WO 2011/079636 A1 | 7/2011 |

OTHER PUBLICATIONS

First Chinese Office Action dated Jul. 20, 2011, issued in Chinese Application No. 200910258858.7 (5 pages).

Second Chinese Office Action dated May 2, 2012, issued in Chinese Application No. 200910258858.7 (6 pages).

PCT International Search Report and Written Opinion mailed Jan. 20, 2011, issued in International Application No. PCT/CN2010/077604 (13 pages).

European Examination Report dated Jun. 30, 2014, issued in European Application No. 10840425.2 (4 pages).

* cited by examiner

EPITAXIAY WAFER, METHOD FOR MANUFACTURING THE SAME AND METHOD FOR MANUFACTURING LED CHIP

CROSS-REFERENCE TO RELATED APPLICATION

This application is a continuation of International Application No. PCT/CN2010/077604, filed Oct. 8, 2010, which claims priority to Chinese Patent Application No. 200910258858.7, filed with the State Intellectual Property Office of People's Republic of China on Dec. 29, 2009, the entire contents of both of which are incorporated herein by reference.

FIELD

The present disclosure generally relates to the semiconductor field, and more particularly, to a method for manufacturing an epitaxial wafer for a light emitting diode (LED), an epitaxial wafer prepared using the same, and a method for manufacturing an LED chip.

BACKGROUND

Because a light emitting diode (LED) has the advantages of long lifespan and high energy utilization rate, it has become a new light source to replace conventional light sources. The color of the light emitted by the LED corresponds to the frequency of the light, which may correspond to the band gap of the semiconductor material. InGaN is a suitable material for a light emitting layer in an LED emitting blue light, green light or purple light. The band gap of GaN is about 3.4 eV, and may be modulated from about 0.7 eV to about 3.4 eV by doping indium.

An epitaxial wafer for an LED may comprise a buffer layer, an N-type semiconductor layer, a multi-quantum well layer and a P-type semiconductor layer which are grown successively. The N-type and P-type semiconductor layers may comprise III-V group compounds, such as GaN or GaAs. A GaN LED is described for illustration purpose in this specification.

Conventionally, an epitaxial wafer for an LED may be manufactured in a metal organic chemical vapor deposition (MOCVD) device. The method for manufacturing the epitaxial wafer may comprise: growing a buffer layer on a top surface of a sapphire substrate through epitaxial technology; growing an N-type GaN layer on the buffer layer through epitaxial technology; growing a multi-quantum well layer on the N-type GaN layer; and growing a P-type semiconductor layer on the multi-quantum well layer.

The wavelength of an LED light may be determined by the content of indium in the multi-quantum well layer. For a multi-quantum well layer containing about 13% indium by weight, the growth temperature may be about 750° C. The indium content may be very sensitive to the growth temperature. When the growth temperature is changed by about 1 K, the indium content may be changed by about 0.3%, and the emission wavelength of the LED may be changed by about 1.5 nm. The MOCVD device may be bottom heated, so that a temperature gradient may be formed from the bottom to the top in the cavity of the MOCVD device. The temperature may thus decrease from the lower part to the upper part of the cavity, and a 2 K temperature difference may exist between the top surface and the lower surface of the sapphire substrate. Due to the temperature difference, the lower surface of the substrate with a higher temperature may undergo a larger thermal expansion, and consequently the substrate may warp upwards and be deformed to a bowl shape from a plate shape. Due to the presence of the temperature gradient, the warped epitaxial wafer may have a height difference of about 10 μm and a temperature difference of about 7 K between the center and edges thereof. Therefore, in the bottom heated MOCVD device, the wavelength of the light emitted from the center and the edge of the epitaxial layer may have a difference of 1.5×7=10.5 nm. In other words, the LED chip comprising the epitaxial wafer may have a poor light uniformity. Therefore, during the manufacture of LED chips, after grinding, polishing, dicing and chipping, point measurement and separation may be needed to obtain LED chips with different wavelengths, which may increase the complexity and cost of the manufacturing processes.

SUMMARY

A method for manufacturing an epitaxial wafer for a light emitting diode (LED), an epitaxial wafer prepared using the same, and a method for manufacturing an LED chip are provided. The LED chip described herein may have an increased light uniformity.

According to an aspect of the present disclosure, a method for manufacturing an epitaxial wafer for an LED is provided. The method may comprise:
  forming a back coating layer on a back surface of a substrate;
  forming a buffer layer on a top surface of the substrate;
  forming an N-type semiconductor layer on the buffer layer;
  forming a multi-quantum well layer on the N-type semiconductor layer; and
  forming a P-type semiconductor layer on the multi-quantum well layer.

According to another aspect of the present disclosure, an epitaxial wafer for an LED is provided. The epitaxial wafer may comprise:
  a substrate;
  a back coating layer formed on a back surface of the substrate;
  a buffer layer formed on a top surface of the substrate;
  an N-type semiconductor layer formed on the buffer layer;
  a multi-quantum well layer formed on the N-type semiconductor layer; and
  a P-type semiconductor layer formed on the multi-quantum well layer.

According to still another aspect of the present disclosure, a method for manufacturing an LED chip is provided. The method may comprise:
  forming a back coating layer on a back surface of a substrate;
  forming a buffer layer on a top surface of the substrate;
  forming an N-type semiconductor layer on the buffer layer;
  forming a multi-quantum well layer on the N-type semiconductor layer;
  forming a P-type semiconductor layer on the multi-quantum well layer;
  partially etching the P-type semiconductor layer and the multi-quantum well layer to expose a part of the N-type semiconductor layer;
  forming an N-type electrode on the exposed part of the N-type semiconductor layer;
  forming a P-type electrode on the P-type semiconductor layer; and
  thinning the back surface of the substrate to remove the back coating layer and a part of the substrate with a predetermined thickness.

According to some embodiments of the present disclosure, a material with a thermal expansion coefficient less than that of the substrate may be coated on the back surface of the substrate to balance the thermal expansion of the back surface of the substrate, so that the warping of the substrate may be inhibited and the top surface of the substrate may be leveled, thereby increasing the uniformity of the emission wavelength of the epitaxial wafer.

Additional aspects and advantages of the embodiments of the present disclosure will be given in part in the following descriptions, become apparent in part from the following descriptions, or be learned from the practice of the embodiments of the present disclosure.

BRIEF DESCRIPTION OF THE DRAWINGS

These and other aspects and advantages of the disclosure will become apparent and more readily appreciated from the following descriptions taken in conjunction with the drawings in which.

DETAILED DESCRIPTION OF CERTAIN EMBODIMENTS

Reference will be made in detail to embodiments of the present disclosure. The embodiments described herein with reference to the accompany drawings are explanatory and illustrative, which are used to generally understand the present disclosure. The embodiments shall not be construed to limit the present disclosure. The same or similar elements and the elements having same or similar functions are denoted by like reference numerals throughout the descriptions.

Figure 1:
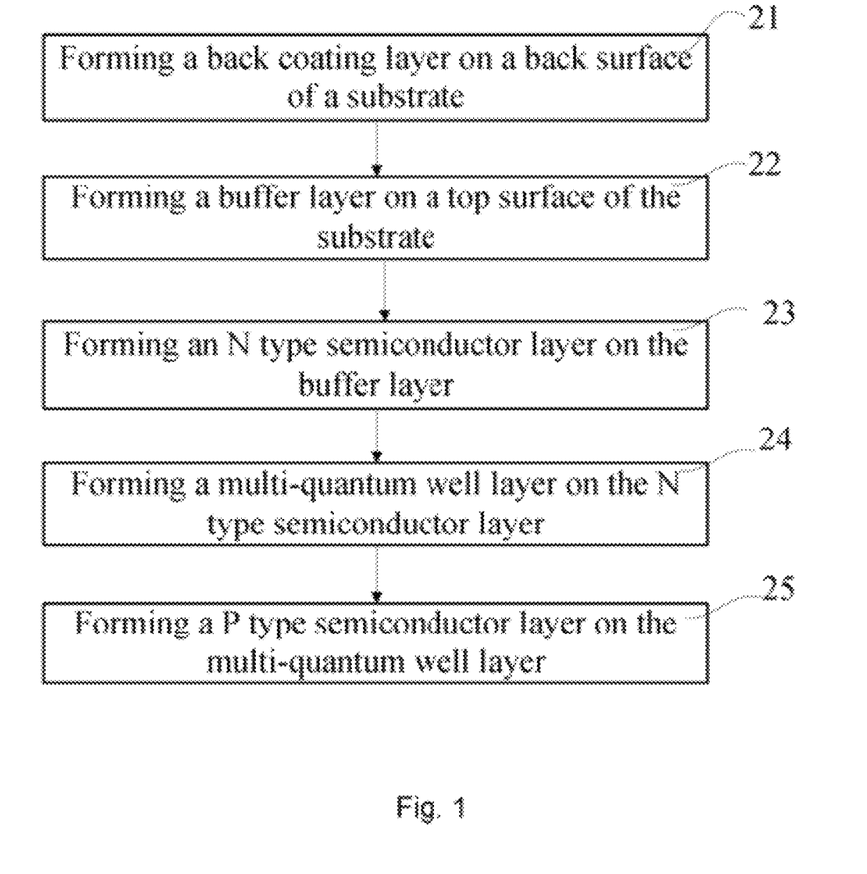
FIG. 1 is a flow chart of a method for manufacturing an epitaxial wafer for an LED according to an embodiment of the present disclosure.

According to some embodiments of the present disclosure, a method for manufacturing an epitaxial wafer for a light emitting diode (LED) is shown in FIG. 1. The epitaxial wafer may be manufactured in, for example but not limited to, a MOCVD device, a molecular beam epitaxy (MBE) device or a hydride vapor phase epitaxy (HVPE) device. In some embodiments, high purity hydrogen or nitrogen may be used as carrier gas. In some embodiments, the Ga source, the In source and the N source may include high purity trimethyl gallium, trimethyl indium and ammonia gas, respectively. In some embodiments, the method for manufacturing the epitaxial wafer for the LED may comprise:

step 21. forming a back coating layer 102 on a back surface of a substrate 101;

step 22. forming a buffer layer 103 on a top surface of the substrate 101;

step 23. forming an N-type semiconductor layer 104 on the buffer layer 103;

step 24. forming a multi-quantum well layer 105 on the N-type semiconductor layer 104; and step 25. forming a P-type semiconductor layer 106 on the multi-quantum well layer 105.

In some embodiments, the substrate 101 may comprise a material chosen from, for example but not limited to, sapphire, SiC, GaN and silicon. In some embodiments, the substrate 101 may have a thickness ranging from about 200 μm to about 500 μm. In some embodiments, the substrate 101 may have a thickness of about 400 μm.

In some embodiments, the back coating layer 102 may have a thermal expansion coefficient less than that of the substrate 101. The material of the back coating layer 102 may not react with the matter in the manufacturing device during manufacturing procedures. In some embodiments, the material of the back coating layer 102 may not react with the metal organic sources, such as Ga, In, Si or Mg sources, or hydrogen, nitrogen, or ammonia gas. In other words, no chemical reaction may occur between the back coating layer 102 and substances in the manufaturing device during epitaxial growth. In some embodiments, the back coating layer 102 may be formed by a method chosen from, for example, physical vapor deposition (PVD), chemical vapor deposition (CVD), electroplating, printing and spin coating. In some embodiments, the back coating layer 102 may comprise a material chosen from, for example but not limited to, aluminum nitride and copper tungsten alloy. However, it should be noted that any material which may not react with other substances in the manufacturing device during epitaxial growth but may balance the thermal expansion of the back surface of the substrate 101 may be used to form the back coating layer 102.

In some embodiments, the buffer layer 103 may comprise a non-crystal GaN layer grown at a temperature ranging from about 450° C. to about 600° C. through epitaxial technology. In some embodiments, the buffer layer 103 may include a non-crystal GaN layer grown at a temperature of about 550° C. through epitaxial technology.

In some embodiments, the N-type semiconductor layer 104 may comprise III-V group compounds chosen from, for example but not limited to, GaN and GaAs. In some embodiments, the N-type semiconductor layer 104 may be doped with an N-type impurity. In some embodiments, the N-type semiconductor layer 104 may comprise a GaN layer doped with silicon and formed at a temperature ranging from about 950° C. to about 1200° C. In some embodiments of the present disclosure, the N-type semiconductor layer 104 may comprise a GaN layer doped with silicon and formed at a temperature of about 1050° C. In some embodiments, the silicon source may be $SiH_4$.

According to some embodiments of the present disclosure, the multi-quantum well layer 105 may comprise an InGaN layer grown at a temperature of about 750° C.

According to some embodiments of the present disclosure, the P-type semiconductor layer 106 may comprise III-V group compounds chosen from, for example but not limited to, GaN and GaAs. In some embodiments, he P-type semiconductor layer 106 may be doped with a P-type impurity. In some embodiments, the P-type semiconductor layer 106 may comprise a GaN layer doped with magnesium and formed at a temperature ranging from about 950° C. to about 1200° C. In some embodiments of the present disclosure, the P-type semiconductor layer may comprise a GaN layer doped with magnesium and formed at a temperature of about 1050° C. In some embodiments, the magnesium source may be $Cp_2Mg$.

Figure 2:
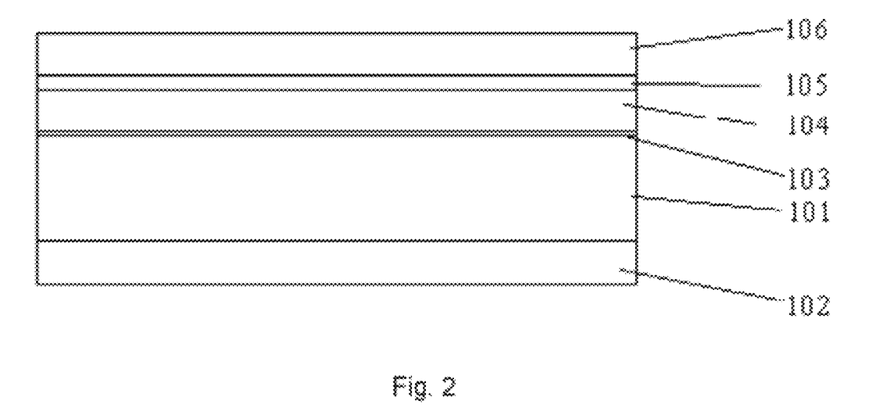
FIG. 2 is a cross-sectional view of an epitaxial wafer for an LED according to an embodiment of the present disclosure.

According to an aspect of the present disclosure, an epitaxial wafer is also provided. In some embodiments as shown in FIG. 2, the epitaxial wafer may comprise:
- a substrate 101;
- a back coating layer 102 formed on a back surface of the substrate 101;
- a buffer layer 103 formed on a top surface of the substrate 101;
- an N-type semiconductor layer 104 formed on the buffer layer 103;
- a multi-quantum well layer 105 formed on the N-type semiconductor layer 104; and
- a P-type semiconductor layer 106 formed on the multi-quantum well layer 105.

In some embodiments, the substrate 101 may comprise a material chosen from, for example but not limited to, sapphire, SiC, GaN and silicon. In some embodiments, the substrate 101 may have a thickness ranging from about 200 μm to about 500 μm. In some embodiments of the present disclosure, the substrate 101 may have a thickness of about 400 μm.

In some embodiments, the thermal expansion coefficient of the material of the back coating layer 102 may be less than that of the substrate 101. The material of the back coating layer 102 may not react with the metal organic sources, such as Ga, In, Si or Mg sources, or hydrogen, nitrogen, or ammonia gas. In other words, no chemical reaction may occur between the back coating layer 102 and other substances in the manufacturing device during the manufacturing procedure. In some embodiments, the back coating layer 102 may comprise a material chosen from, for example but not limited to, aluminum nitride and copper tungsten alloy. Any material that may not react with other substances in the manufacturing device during epitaxial growth but may balance the thermal expansion of the back surface of the substrate 101 may be used to form the back coating layer 102.

According to some embodiments of the present disclosure, the buffer layer 103 may comprise a non-crystal GaN layer. In some embodiments, the N-type semiconductor layer 104 may comprise III-V group compounds chosen from, for example but not limited to, GaN and GaAs. In some embodiments, the N-type semiconductor layer 104 may be doped with an N-type impurity. In some embodiments, the N-type semiconductor layer 104 may comprise a GaN layer doped with silicon. According to some embodiment of the present disclosures, the multi-quantum well layer 105 may comprise an InGaN layer. In some embodiments, the P-type semiconductor layer 106 may comprise III-V group compounds chosen from, for example but not limited to, GaN and GaAs. In some embodiments, the P-type semiconductor layer 106 may be doped with a P-type impurity. In some embodiments, the P-type semiconductor layer 106 may comprise a GaN layer doped with magnesium.

In some embodiments, the thickness of the back coating layer 102 may be determined by the thermal expansion coefficient and the elastic modulus of the material of the back coating layer 102 in order to obtain an epitaxial wafer with a uniform wavelength distribution. In some embodiments, the back coating layer 102 may have a thickness controlled within a certain range according to the thickness of the substrate 101 to inhibit the warping of the substrate in order to obtain an epitaxial wafer with a uniform wavelength distribution.

According to some embodiments of the present disclosure, the back coating layer 102 may comprise an aluminum nitride (AlN) layer, which may have a thermal expansion coefficient of about 4.5e-6/K and an elastic modulus of about 270 GPa. When the substrate 101 has a thickness of about 400 μm and the AlN layer has a thickness ranging from about 0.27 μm to about 0.31 μm, and when the temperature in the manufacturing device is about 750° C. and there is a vertical temperature gradient in the manufacturing device, the surface of the substrate 101 may have a vertical height difference below 0.476 μm. Thus, the emission wavelength fluctuation of the multi-quantum wall layer 105 caused by the temperature gradient, i.e., the emission wavelength difference between the center and the edges of the same epitaxial wafer, may be reduced to below about 1 nm. In some embodiments, the AlN layer may have a thickness ranging from about 0.27 μm to about 0.31 μm. In some embodiments, the AlN layer may have a thickness ranging from about 0.27 μm to about 0.30 μm. In some embodiments, the AlN layer may have a thickness ranging from about 0.27 μm to about 0.29 μm. In some embodiments, the AlN layer may have a thickness of about 0.28 μm.

Figure 3:
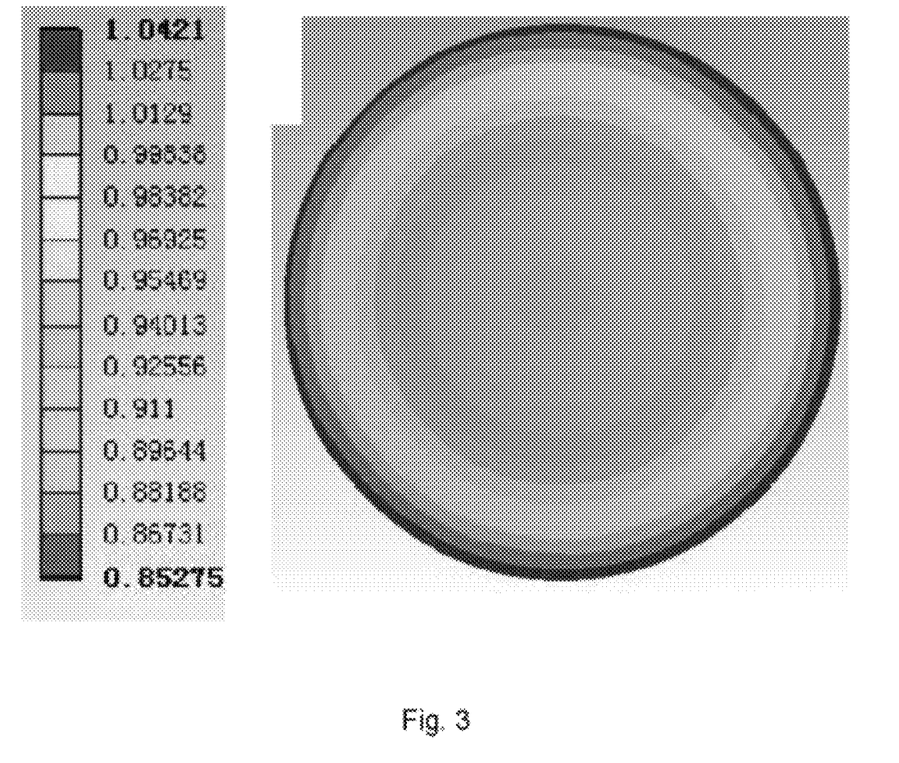
FIG. 3 is a schematic view of a vertical height distribution of the surface of a substrate with a back coating layer comprising aluminum nitride according to an embodiment of the present disclosure.

When the back coating layer 102 comprises an AlN layer having a thickness of about 0.28 μm and the temperature in the manufacturing device is about 750° C. with a vertical temperature gradient, the substrate 101 may have a surface with a vertical height distribution shown in FIG. 3. The vertical height of the substrate 101 may increase from the center to the edges of the substrate 101. The maximum height of the edges may be about 1.0421 μm, and the vertical height of the center may be about 0.85275 μm, so the vertical height difference may thus be reduced to about 0.2 μm. Compared with conventional epitaxial wafers without a back coating layer formed on the back surface of the substrate, the vertical height difference of the surface of the substrate of the epitaxial wafer described herein is greatly reduced, and the emission wavelength difference between the center and the edges of the epitaxial wafer may thus be reduced.

According to some embodiments of the present disclosure, the back coating layer 102 may comprise a copper tungsten alloy layer, which may comprise 10% copper by weight and have a thermal expansion coefficient of about 5.7e-6/K and an elastic modulus of about 128 GPa. When the substrate 101 has a thickness of about 400 μm and the copper tungsten alloy layer has a thickness ranging from about 0.51 μm to about 0.56 μm, and when the temperature in the manufacturing device is about 750° C. and there is a vertical temperature gradient in the manufacturing device, the surface of the substrate 101 may have a vertical height difference less than about 0.476 μm. Thus, the emission wavelength fluctuation of the multi-quantum wall layer 105 caused by the temperature gradient, i.e., the emission wavelength difference between the center and the edges of the same epitaxial wafer, may be reduced to less than 1 nm. In some embodiments, In some embodiments, the copper tungsten alloy layer may have a thickness ranging from about 0.51 μm to about 0.56 μm. In some embodiments, the copper tungsten alloy layer may have a thickness ranging from about 0.52 μm to about 0.56 μm. In some embodiments, the copper tungsten alloy layer may have a thickness ranging from about 0.52 μm to about 0.55 μm. In some embodiments, the copper tungsten alloy layer may have a thickness of about 0.52 μm, 0.53 μm or 0.55 μm.

Figure 4:
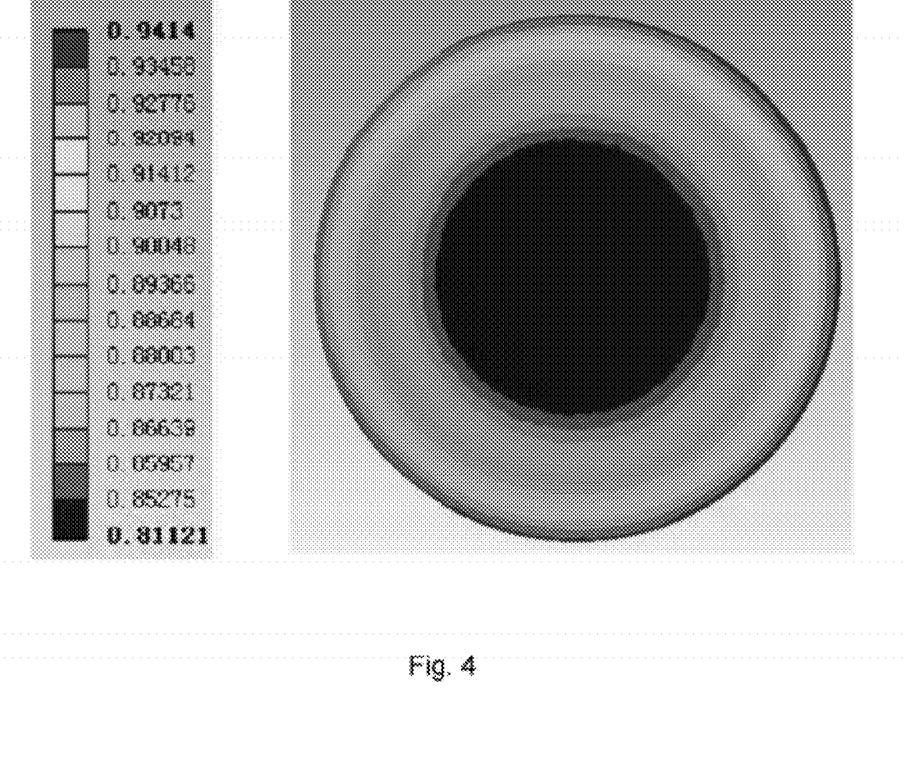
FIG. 4 is a schematic view of a vertical height distribution of the surface of a substrate with a back coating layer comprising copper tungsten alloy according to an embodiment of the present disclosure.

When the back coating layer 103 comprises an AlN layer having a thickness of about 0.53 μm, the temperature in the manufacturing device is about 750° C., and there is a vertical temperature gradient in the manufacturing device, the substrate 101 may have a surface with a vertical height distribution shown in FIG. 4. The vertical height of the substrate 101 may increase from the center to the edges of the substrate 101. The maximum height of the edges may be about 0.9414 μm, and the vertical height of the center is about 0.81121 μm, so the vertical height difference may be reduced to about 0.1 μm. Compared with conventional epitaxial wafers without a back coating layer on the back surface of the substrate, the vertical height difference of the surface of the substrate of the epitaxial wafer described herein may be reduced greatly, and the emission wavelength difference between the center and the edges of the epitaxial wafer may thus be reduced greatly.

As described above, during the manufacture of the epitaxial wafer, by forming a back coating layer on the back surface of the substrate to inhibit the warping of the substrate, the vertical height difference of the substrate surface may be reduced, thereby increasing the uniformity of the emission wavelength of the epitaxial wafer.

Figure 5:
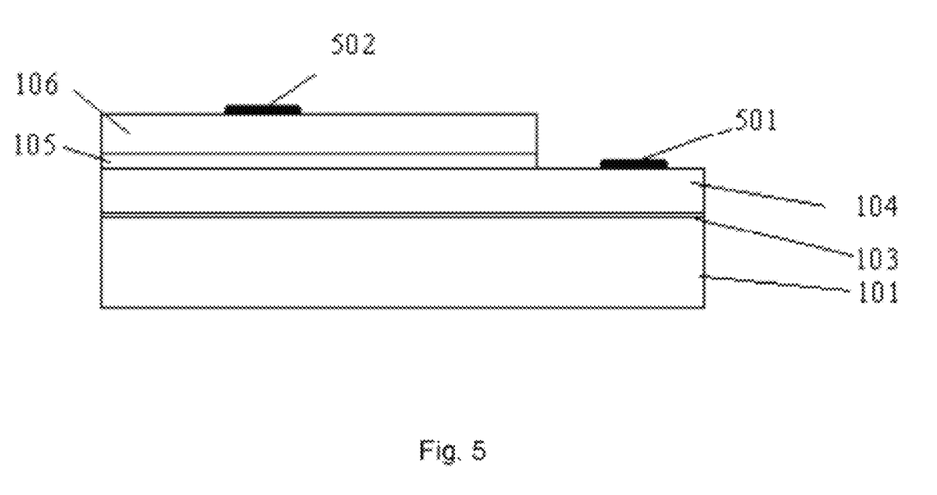
FIG. 5 is a cross-sectional view of an LED chip according to an embodiment of the present disclosure.

A method for manufacturing an LED chip comprsing the epitaxial wafer described above is also provided. In some embodiments, the method for manufacturing the LED chip may comprise:

forming a back coating layer 102 on a back surface of a substrate 101;
forming a buffer layer 103 on a top surface of the substrate 101;
forming an N-type semiconductor layer 104 on the buffer layer 103;
forming a multi-quantum well layer 105 on the N-type semiconductor layer 104;
forming a P-type semiconductor layer 106 on the multi-quantum well layer 105;
partially etching the P-type semiconductor layer 106 and the multi-quantum well layer 105 to expose a part of the N-type semiconductor layer 104;
forming an N-type electrode 501 on the exposed part of the N-type semiconductor layer 104;
forming a P-type electrode 502 on the P-type semiconductor layer 106; and
thinning the back surface of the substrate 101 to remove the back coating layer 102 and a part of the substrate 101 with a predetermined thickness.

In some embodiments, after forming the N-type and P-type electrodes 510 and 502, the back surface of the substrate 101 may be thinned by grinding or polishing. Thereby, the back coating layer 102 may be removed during the thinning of the back surface of the substrate 101. Thus, in some embodiments, additional steps to treat the back coating layer 102 may not be needed. Therefore, the method for manufacturing the LED chip according to some embodiments of the present disclosure may be easy to realize and may not reduce the output efficiency of the LED chip.

In some embodiments as shown in FIG. 5, the LED chip may comprise:

a substrate 101;
a buffer layer 103 formed on a top surface of the substrate 101;
an N-type semiconductor layer 104 formed on the buffer layer 103;
a multi-quantum well layer 105 formed on the N-type semiconductor layer 104;
a P-type semiconductor layer 106 formed on the multi-quantum well layer 105;
an N-type electrode 501 formed on the N-type semiconductor layer 104; and
a P-type electrode 502 formed on the P-type semiconductor layer 106.

During the manufacture of the LED chip as described above, a back coating layer 102 may be formed on the back surface of the substrate 101, so that the warping of the substrate 101 may be inhibited. And then the back coating layer 102 may be removed. Therefore, even if a bottom-heated manufacturing device with a vertical temperature gradient may be used in the method described herein, the temperature difference of the surface of the epitaxial wafer may be reduced, thereby increasing the uniformity of the emission wavelength of the LED chip.

According to the some embodiments of the present disclosure, a material with a thermal expansion coefficient less than that of the substrate 101 may be coated on the back surface of the substrate 101 to balance the thermal expansion of the back surface of the substrate, so that the warping of the substrate 101 may be inhibited and the top surface of the substrate 101 may be leveled, thereby increasing the uniformity of the emission wavelength of the epitaxial wafer.

It will be appreciated by those skilled in the art that changes could be made to the examples described above without departing from the broad inventive concept. It is understood, therefore, that this disclosure is not limited to the particular examples disclosed, but it is intended to cover modifications within the spirit and scope of the present disclosure as defined by the appended claims.

What is claimed is:

1. A method for manufacturing an epitaxial wafer for a light emitting diode (LED), comprising:
    forming a back coating layer on a back surface of a substrate;
    forming a buffer layer on a top surface of the substrate;
    forming an N-type semiconductor layer on the buffer layer;
    forming a multi-quantum well layer on the N-type semiconductor layer; and
    forming a P-type semiconductor layer on the multi-quantum well layer,
    wherein the substrate includes a sapphire substrate; and
    wherein the back coating layer comprises a copper tungsten alloy layer.

2. The method according to claim 1, wherein the back coating layer has a thermal expansion coefficient less than the thermal expansion coefficient of the substrate.

3. The method according to claim 1, wherein the back coating layer comprises an aluminum nitride layer.

4. The method according to claim 3, wherein the aluminum nitride layer has a thickness ranging from about 0.27 μm to about 0.31 μm.

5. The method according to claim 1, wherein the copper tungsten alloy layer comprises about 10% copper by weight.

6. The method according to claim 1, wherein the copper tungsten alloy layer has a thickness ranging from about 0.51 μm to about 0.56 μm.

7. A method for manufacturing an LED chip, comprising:
    forming a back coating layer on a back surface of a substrate;
    forming a buffer layer on a top surface of the substrate;
    forming an N-type semiconductor layer on the buffer layer;
    forming a multi-quantum well layer on the N-type semiconductor layer;
    forming a P-type semiconductor layer on the multi-quantum well layer;
    partially etching the P-type semiconductor layer and the multi-quantum well layer to expose a part of the N-type semiconductor layer;
    forming an N-type electrode on the exposed part of the N-type semiconductor layer;
    forming a P-type electrode on the P-type semiconductor layer; and
    thinning the back surface of the substrate to remove the back coating layer and a part of the substrate with a predetermined thickness.

8. The method according to claim 7, wherein the back coating layer has a thermal expansion coefficient less than the thermal expansion coefficient of the substrate.

9. The method according to claim 7, wherein the back coating layer comprises an aluminum nitride layer.

10. The method according to claim 9, wherein the aluminum nitride layer has a thickness ranging from about 0.27 μm to about 0.31 μm.

11. The method according to claim 7, wherein the back coating layer comprises a copper tungsten alloy layer.

12. The method according to claim 11, wherein the copper tungsten alloy layer comprises about 10% copper by weight.

13. The method according to claim 11, wherein the copper tungsten alloy layer has a thickness of about 0.51 μm to about 0.56 μm.

14. An epitaxial wafer for an LED, comprising:
a substrate;
a back coating layer formed on a back surface of the substrate;
a buffer layer formed on a top surface of the substrate;
an N-type semiconductor layer formed on the buffer layer;
a multi-quantum well layer formed on the N-type semiconductor layer; and
a P-type semiconductor layer formed on the multi-quantum well layer,
wherein the substrate includes a sapphire substrate; and
wherein the back coating layer comprises a copper tungsten alloy.

15. The epitaxial wafer according to claim 14, wherein the back coating layer has a thermal expansion coefficient less than thermal expansion coefficient of the substrate.

16. The epitaxial wafer according to claim 14, wherein the back coating layer comprises an aluminum nitride layer, wherein the aluminum nitride layer has a thickness ranging from about 0.27 μm to about 0.31 μm.

17. The epitaxial wafer according to claim 14, wherein the copper tungsten alloy layer comprises about 10% copper by weight.

18. The epitaxial wafer according to claim 14, wherein the copper tungsten alloy layer has a thickness ranging from about 0.51 μm to about 0.56 μm.

* * * * *